United States Patent
Visser

(10) Patent No.: US 11,037,703 B2
(45) Date of Patent: Jun. 15, 2021

(54) SHIELDING TAPE WITH MULTIPLE FOIL LAYERS

(71) Applicant: PCT International, Inc., Mesa, AZ (US)

(72) Inventor: Leonard James Visser, Huntsville, AR (US)

(73) Assignee: PCT International, Inc., Tempe, AZ (US)

( * ) Notice: Subject to any disclaimer, the term of this patent is extended or adjusted under 35 U.S.C. 154(b) by 0 days.

(21) Appl. No.: 16/544,748

(22) Filed: Aug. 19, 2019

(65) Prior Publication Data

US 2020/0043635 A1 Feb. 6, 2020

Related U.S. Application Data

(60) Division of application No. 15/644,477, filed on Jul. 7, 2017, now Pat. No. 10,424,423, which is a continuation of application No. 12/605,908, filed on Oct. 26, 2009, now Pat. No. 9,728,304.

(60) Provisional application No. 61/226,250, filed on Jul. 16, 2009.

(51) Int. Cl.
*H01B 11/18* (2006.01)
*H01B 11/10* (2006.01)
*H05K 9/00* (2006.01)

(52) U.S. Cl.
CPC ..... *H01B 11/1813* (2013.01); *H01B 11/1008* (2013.01); *H05K 9/0098* (2013.01); *H01B 11/1016* (2013.01); *H01B 11/1826* (2013.01); *Y10T 29/49123* (2015.01)

(58) Field of Classification Search
None
See application file for complete search history.

(56) References Cited

U.S. PATENT DOCUMENTS 2,178,365 A 10/1939 Brobst
2,232,846 A * 2/1941 Freydberg .............. H01B 7/366
174/112

(Continued)

FOREIGN PATENT DOCUMENTS

DE 10050445 4/2002
EP 1075698 11/1999

(Continued)

OTHER PUBLICATIONS

Final Office Action dated Jul. 21, 2015 in U.S. Appl. No. 12/605,908, 15 pages.

(Continued)

*Primary Examiner* — Timothy J. Dole
*Assistant Examiner* — Muhammed Azam
(74) *Attorney, Agent, or Firm* — Thomas W. Galvani, P.C.; Thomas W. Galvani

(57) ABSTRACT

A coaxial cable of the present invention comprises a center conductor, a dielectric surrounding the center conductor, a shielding tape surrounding the dielectric, a braided metal surrounding the shielding tape, and an outer jacket surrounding the braided metal. The shielding tape comprises: (i) a first shielding layer bonded to a first separating layer; (ii) a second shielding layer bonded to the first separating layer and a second separating layer; and (iii) a third shielding layer bonded to the second separating layer.

20 Claims, 7 Drawing Sheets

(56) References Cited

U.S. PATENT DOCUMENTS

| | | | | |
|---|---|---|---|---|
| 2,669,695 A | * | 2/1954 | Bird | H04B 15/025 333/12 |
| 2,769,148 A | | 10/1956 | Clogston | |
| 3,076,235 A | | 2/1963 | Rollins | |
| 3,229,623 A | | 1/1966 | Rubenstein | |
| 3,379,824 A | | 4/1968 | Kempf | |
| 3,588,317 A | * | 6/1971 | Hutchins, Jr. | H01B 11/1025 174/108 |
| 3,662,090 A | | 5/1972 | Grey | |
| 4,029,006 A | | 6/1977 | Mercer | |
| 4,092,452 A | * | 5/1978 | Hori | B32B 15/08 174/107 |
| 4,096,346 A | * | 6/1978 | Stine | F16L 11/06 174/36 |
| 4,100,003 A | | 7/1978 | Trusch | |
| 4,117,260 A | | 9/1978 | Wilkenloh | |
| 4,125,739 A | * | 11/1978 | Bow | H01B 9/022 174/36 |
| 4,221,926 A | | 9/1980 | Schneider | |
| 4,340,771 A | * | 7/1982 | Watts | H01B 11/1016 174/106 D |
| 4,371,742 A | | 2/1983 | Manly | |
| 4,484,023 A | | 1/1984 | Gindrup | |
| 4,439,632 A | | 3/1984 | Aloisio | |
| 4,465,717 A | | 8/1984 | Crofts | |
| 4,472,595 A | | 9/1984 | Fox | |
| 4,477,693 A | * | 10/1984 | Krabec | H01B 11/1016 174/105 R |
| 4,487,996 A | | 12/1984 | Rabinowitz et al. | |
| 4,515,992 A | | 5/1985 | Gupta | |
| 4,557,560 A | | 12/1985 | Bohannon, Jr. | |
| 4,564,723 A | | 1/1986 | Lang | |
| 4,569,704 A | * | 2/1986 | Bohannon, Jr. | H01B 7/202 156/48 |
| 4,595,431 A | * | 6/1986 | Bohannon, Jr. | H01B 13/10 156/203 |
| 4,641,110 A | * | 2/1987 | Smith | H01B 11/10 174/36 |
| 4,642,417 A | * | 2/1987 | Ruthrof | H01B 11/1813 174/105 R |
| 4,691,081 A | | 9/1987 | gupta | |
| 4,694,122 A | * | 9/1987 | Visser | H01B 13/26 156/53 |
| 4,729,629 A | | 3/1988 | Saito | |
| 4,760,362 A | | 7/1988 | Maki | |
| 4,774,148 A | | 9/1988 | Goto | |
| 4,894,488 A | | 1/1990 | Gupta | |
| 4,965,412 A | | 10/1990 | Lai | |
| 4,997,994 A | | 3/1991 | Andrews | |
| 5,043,538 A | * | 8/1991 | Hughey, Jr. | H01B 7/2825 174/107 |
| 5,043,539 A | * | 8/1991 | Connole | H01B 7/202 174/106 D |
| 5,049,721 A | | 9/1991 | Parnas | |
| 5,132,491 A | | 7/1992 | Mulrooney | |
| 5,146,391 A | * | 9/1992 | MacFarlane | H01B 1/122 361/525 |
| 5,194,291 A | * | 3/1993 | D'Aoust | C23C 16/505 118/723 R |
| 5,216,202 A | | 6/1993 | Yoshida | |
| 5,298,682 A | * | 3/1994 | Saiz | H01B 11/1869 174/105 R |
| 5,329,064 A | * | 7/1994 | Tash | H01B 11/1016 174/106 R |
| 5,355,720 A | | 10/1994 | Bailey | |
| 5,412,856 A | | 5/1995 | Nazerian | |
| 5,414,213 A | * | 5/1995 | Hillburn | H01B 11/1826 174/36 |
| 5,444,466 A | * | 8/1995 | Smyczek | G02B 6/4482 101/35 |
| 5,471,144 A | | 11/1995 | Meyer | |
| 5,493,070 A | | 2/1996 | Habu | |
| 5,515,848 A | * | 5/1996 | Corbett, III | A61F 11/04 600/377 |
| 5,521,331 A | | 5/1996 | Hillburn | |
| 5,538,586 A | * | 7/1996 | Swanson | B41J 2/1603 156/309.6 |
| 5,560,536 A | | 10/1996 | Moe et al. | |
| 5,695,431 A | | 12/1997 | Bond et al. | |
| 5,707,465 A | | 1/1998 | Bibber | |
| 5,719,353 A | | 2/1998 | Carlson | |
| 5,770,988 A | | 6/1998 | Goto et al. | |
| 5,796,042 A | * | 8/1998 | Pope | H01B 7/288 174/102 SP |
| 5,912,433 A | * | 6/1999 | Pulido | H02G 15/013 174/74 R |
| 5,926,949 A | | 7/1999 | Moe et al. | |
| 5,945,632 A | | 8/1999 | Butera | |
| 5,949,018 A | * | 9/1999 | Esker | H01B 7/288 174/106 R |
| 5,959,245 A | | 9/1999 | Moe et al. | |
| 5,969,295 A | | 10/1999 | Boucino | |
| 5,969,456 A | * | 10/1999 | Okamoto | H01F 5/06 174/127 |
| 6,037,545 A | | 3/2000 | Fox | |
| 6,052,043 A | | 4/2000 | Gotoh et al. | |
| 6,087,017 A | | 7/2000 | Bibber | |
| 6,127,441 A | | 10/2000 | Sakamoto | |
| 6,137,058 A | | 10/2000 | Moe et al. | |
| 6,148,130 A | | 11/2000 | Lee | |
| 6,201,189 B1 | | 3/2001 | Carlson | |
| 6,201,190 B1 | | 3/2001 | Pope | |
| 6,204,445 B1 | | 3/2001 | Gialenios | |
| 6,218,017 B1 | * | 4/2001 | Yamashita | B32B 9/00 428/424.2 |
| 6,246,006 B1 | | 6/2001 | Hardin | |
| 6,265,667 B1 | | 7/2001 | Stipes | |
| 6,282,778 B1 | | 9/2001 | Fox | |
| 6,284,374 B1 | * | 9/2001 | Yamazaki | B32B 7/06 174/105 SC |
| 6,288,628 B1 | | 9/2001 | Fujimori | |
| 6,326,551 B1 | | 12/2001 | Adams | |
| 6,371,585 B2 | | 4/2002 | Kurachi | |
| 6,372,990 B1 | | 4/2002 | Saito | |
| 6,384,337 B1 | | 5/2002 | Drum | |
| 6,417,454 B1 | | 7/2002 | Biebuyck | |
| 6,462,436 B1 | | 10/2002 | Kay | |
| 6,498,301 B1 | | 12/2002 | Pieper | |
| 6,545,222 B2 | | 4/2003 | Yokokawa | |
| 6,583,361 B2 | * | 6/2003 | Clouet | H01B 11/183 174/108 |
| 6,596,393 B1 | | 7/2003 | Houston | |
| 6,610,931 B2 | | 8/2003 | Perelman | |
| 6,734,364 B2 | | 5/2004 | Price | |
| 6,770,819 B2 | | 8/2004 | Patel | |
| 6,800,809 B2 | | 10/2004 | Moe et al. | |
| 6,800,811 B1 | | 10/2004 | Boucino | |
| 6,817,272 B2 | | 11/2004 | Holland | |
| 6,818,832 B2 | | 11/2004 | Hopkinson | |
| 6,846,536 B1 | | 1/2005 | Priesnitz | |
| 6,848,939 B2 | | 2/2005 | Stirling | |
| 6,858,805 B2 | | 2/2005 | Blew | |
| 6,875,928 B1 | | 4/2005 | Hayes | |
| 6,915,564 B2 | | 7/2005 | Adams | |
| 6,997,999 B2 | | 2/2006 | Houston | |
| 7,022,918 B2 | | 4/2006 | Gialenios | |
| 7,052,283 B2 | | 5/2006 | Pixley | |
| 7,084,343 B1 | * | 8/2006 | Visser | C09D 167/00 174/102 R |
| 7,127,806 B2 | | 10/2006 | Nelson | |
| 7,157,645 B2 | * | 1/2007 | Huffman | H01B 11/1826 174/106 R |
| 7,210,940 B2 | | 5/2007 | Bailey | |
| 7,228,625 B1 | * | 6/2007 | Zerebilov | H01R 9/032 174/34 |
| 7,299,550 B2 | | 11/2007 | Montena | |
| 7,314,998 B2 | | 1/2008 | Amato | |
| 7,468,489 B2 | | 12/2008 | Alrutz | |
| 7,497,002 B2 | | 3/2009 | Chawgo | |
| 7,507,117 B2 | | 3/2009 | Amidon | |

(56) References Cited

U.S. PATENT DOCUMENTS

| | | | |
|---|---|---|---|
| 7,566,236 B2 | 7/2009 | Malloy | |
| 9,728,304 B2 | 8/2017 | Visser | |
| 10,068,686 B2* | 9/2018 | Kumada | H01B 7/0225 |
| 10,424,423 B2 | 9/2019 | Visser | |
| 10,510,469 B2* | 12/2019 | Kumada | H01B 11/1834 |
| 10,573,980 B2* | 2/2020 | Mathews | H01B 11/1895 |
| 10,826,108 B2* | 11/2020 | Wensley | H01M 2/1653 |
| 2001/0040042 A1* | 11/2001 | Stipes | H01B 11/1016 |
| | | | 174/113 R |
| 2002/0046849 A1* | 4/2002 | Rapp | H05K 9/0015 |
| | | | 29/603.27 |
| 2002/0053446 A1 | 5/2002 | Moe et al. | |
| 2003/0044606 A1 | 3/2003 | Iskander | |
| 2003/0150633 A1* | 8/2003 | Hirakawa | H01B 11/1016 |
| | | | 174/36 |
| 2004/0007308 A1 | 1/2004 | Houston | |
| 2004/0085183 A1* | 5/2004 | Ha | H01C 17/288 |
| | | | 338/309 |
| 2004/0222009 A1 | 11/2004 | Blew | |
| 2005/0042960 A1* | 2/2005 | Yeh | H05K 9/0088 |
| | | | 442/131 |
| 2006/0034638 A1* | 2/2006 | Kamijo | G03G 15/104 |
| | | | 399/237 |
| 2006/0048963 A1* | 3/2006 | Nishinaka | B32B 15/08 |
| | | | 174/393 |
| 2007/0037419 A1* | 2/2007 | Sparrowhawk | H01B 11/1008 |
| | | | 439/98 |
| 2007/0291462 A1 | 12/2007 | Peng | |
| 2008/0314636 A1* | 12/2008 | Ogura | H01B 11/1895 |
| | | | 174/350 |
| 2009/0008142 A1* | 1/2009 | Shimizu | H05K 1/0366 |
| | | | 174/261 |
| 2009/0020712 A1* | 1/2009 | Matsumoto | C25D 7/0614 |
| | | | 250/515.1 |
| 2009/0126984 A1* | 5/2009 | Saneto | H05K 9/0096 |
| | | | 174/350 |
| 2009/0133922 A1* | 5/2009 | Okazaki | H05K 9/0096 |
| | | | 174/389 |
| 2009/0151998 A1* | 6/2009 | Fujiwara | H05K 9/0096 |
| | | | 174/350 |
| 2009/0283296 A1* | 11/2009 | Shimosawa | H01B 11/1826 |
| | | | 174/107 |
| 2010/0276176 A1* | 11/2010 | Amato | H01B 11/1016 |
| | | | 174/11 OR |
| 2011/0011638 A1* | 1/2011 | Gemme | H01B 7/366 |
| | | | 174/350 |
| 2011/0011639 A1* | 1/2011 | Visser | H01B 11/1008 |
| | | | 174/350 |
| 2012/0255761 A1* | 10/2012 | Shanai | H01B 7/295 |
| | | | 174/117 F |
| 2012/0312592 A1* | 12/2012 | Matano | H01J 11/44 |
| | | | 174/350 |
| 2013/0037304 A1* | 2/2013 | Ikeda | H01B 3/30 |
| | | | 174/119 C |
| 2013/0248232 A1* | 9/2013 | Chang | B29C 59/00 |
| | | | 174/257 |
| 2014/0218642 A1* | 8/2014 | Iwami | H05K 3/12 |
| | | | 349/12 |
| 2015/0034360 A1* | 2/2015 | Muto | C08K 3/22 |
| | | | 174/110 SR |
| 2015/0053950 A1* | 2/2015 | Suematsu | H05K 1/0274 |
| | | | 257/40 |
| 2015/0068907 A1* | 3/2015 | Fujikawa | C09D 11/322 |
| | | | 205/50 |
| 2015/0250078 A1* | 9/2015 | Matsuda | G06F 3/045 |
| | | | 349/12 |
| 2016/0037632 A1* | 2/2016 | Murakawa | H05K 1/0298 |
| | | | 174/257 |
| 2019/0013559 A1* | 1/2019 | Suenaga | H01B 3/441 |
| 2019/0013560 A1* | 1/2019 | Suenaga | H01P 3/02 |
| 2019/0191601 A1* | 6/2019 | Suenaga | H01B 11/002 |
| 2019/0348196 A1* | 11/2019 | Hornung | H01R 13/6592 |
| 2020/0234855 A1* | 7/2020 | Sagawa | H01B 13/165 |

FOREIGN PATENT DOCUMENTS

| | | |
|---|---|---|
| EP | 1335390 | 8/2003 |
| JP | 2004128158 | 4/2004 |
| WO | 2003013848 | 2/2003 |
| WO | 200506353 | 1/2005 |
| WO | 2011009006 | 1/2011 |

OTHER PUBLICATIONS

Final Office Action dated Jun. 23, 2014 in U.S. Appl. No. 12/605,908, 22 pages.

Final Office Action dated Mar. 18, 2013 in U.S. Appl. No. 12/605,908, 17 pages.

Final Office Action dated Nov. 2, 2016 in U.S. Appl. No. 12/605,908, 20 pages.

International Search Report and Written Opinion dated Dec. 28, 2010 in International Application No. PCT/US2010/042198, 9 pages.

Non-Final Office Action dated Dec. 11, 2014 in U.S. Appl. No. 12/605,908, 14 pages.

Non-Final Office Action dated Mar. 21, 2016 in U.S. Appl. No. 12/605,908, 15 pages.

Non-Final Office Action dated Nov. 12, 2013 in U.S. Appl. No. 12/605,908, 17 pages.

Non-Final Office Action dated Oct. 24, 2011 in U.S. Appl. No. 12/605,908, 17 page.

Notice of Allowance dated Apr. 7, 2017 in U.S. Appl. No. 12/605,908, 7 pages.

Non-Final Office Action dated Oct. 2, 2018 in U.S. Appl. No. 15/644,477, 10 pages.

Notice of Allowance dated May 14, 2019 in U.S. Appl. No. 15/644,477, 10 pages.

Pico/Macom GRB-I and "Pico/Macom GRB-2" single and dual coax cable ground blocks, Stallions Satellite and Antenna—Grounding Products, dated Nov. 9, 2005 and printed Aug. 17, 2011, 3 pgs., located online at: http://web.archive.org/web/20051109024213/http://tvantenna.com/products/installation/grounding.html.

* cited by examiner

SHIELDING TAPE WITH MULTIPLE FOIL LAYERS

CROSS REFERENCE TO RELATED APPLICATIONS

The present application is a division of U.S. patent application Ser. No. 15/644,477, filed Jul. 7, 2017, titled "Shielding Tape With Multiple Foil Layers," which is a continuation of U.S. patent application Ser. No. 12/605,908, filed Oct. 26, 2009, titled "Shielding tape With Multiple Foil Layers," which claims the benefit of and priority to U.S. Provisional Patent Application No. 61/226,250 filed Jul. 16, 2009, titled "Shielding Tape With Multiple Foil Layers," the disclosures of which are fully incorporated herein by reference for all purposes.

BACKGROUND

Shielding is used in a variety of cables to reduce electrical interference that could affect a signal travelling through the cable. The shielding also helps to prevent the signal from radiating from the cable and interfering with other devices. One such type of shielding includes either one or two layers of aluminum or other shielding material (such as silver, copper, or Mu-metal) wherein each shielding layer is laminated onto (and if there is more than one shielding layer, each shielding layer is separated by) a separating layer, such as a plastic, e.g., polyethylene terephthalate ("PET") or a polyolefin such as polypropylene ("PP"). This type of shielding that combines layers of shielding material and separating layers is often referred to as either "foil," "laminated tape," "shielding tape," "shielding laminate tape," and combinations or variations thereof.

In some cables, such as coaxial cables, multiple layers of shielding tape (each of which has either one shielding layer or two shielding layers) are employed in the cable. For example, "tri-shield" cable includes an inner foil surrounded by a braid, which is in turn surrounded by an outer foil. "Quad-shield" cable includes an inner foil surrounded by an inner braid, which is in turn surrounded by an outer foil, in turn surrounded by an outer braid.

Multiple layers of shielding tape, while providing better shielding performance, also add to the cost and complexity of producing the cabling. Conventional shielding tape, with only one or two shielding layers, is susceptible to allowing RF signal egress or ingress as micro-cracks form in the shielding layers and align with each other as a result of flexing the cable. Furthermore, the outer shielding structures (such as tape) of conventional cables must often be removed in order to attach a connector. These outer shielding structures may also separate and interfere with the attachment of a connector to the cable.

The present invention overcomes these and other problems associated with conventional shielding tape and cable designs. In particular, by using shielding tape of the present invention (that incorporates three or more shielding layers) as the inner foil of a cable, outer shielding structures (such as shielding tape and/or braids) can be eliminated. This not only reduces the cost of the cable, but obviates the need for these outer shielding structures to be removed to attach a connector to the cable. Likewise, by including additional shielding layers to the inner shielding tape, the present invention eliminates the potential problem of the outer shielding structures separating and interfering with connector attachment. Furthermore, the use of three or more shielding layers in the shielding tape of the present invention improves the flex life of the shield tape by covering micro-cracks in the metal layers with additional shielding layers, thus reducing signal egress or ingress.

SUMMARY OF THE INVENTION

A coaxial cable of the present invention comprises a center conductor, a dielectric surrounding the center conductor, a shielding tape surrounding the dielectric, a braided metal surrounding the shielding tape, and an outer jacket surrounding the braided metal. The shielding tape comprises: (i) a first shielding layer bonded to a first separating layer; (ii) a second shielding layer bonded to the first separating layer and a second separating layer; and (iii) a third shielding layer bonded to the second separating layer. The present invention eliminates the potential problem of the outer shielding structures separating and interfering with connector attachment. Furthermore, the use of three or more shielding layers in the shielding tape of the present invention improves the flex life of the shield tape by covering micro-cracks in the metal layers with additional shielding layers, thus reducing signal egress or ingress. Accordingly, the present invention provides cost savings and/or an improvement in shielding performance.

A cable according to another aspect of the present invention includes a center conductor and a shielding tape surrounding the center conductor. The shielding tape comprises (i) a first shielding layer bonded to a first separating layer; (ii) a second shielding layer bonded to the first separating layer and a second separating layer; and (iii) a third shielding layer bonded to the second separating layer.

A shielding tape according to another aspect of the present invention comprises a first shielding layer bonded to a first separating layer, a second shielding layer bonded to the first separating layer and a second separating layer, and a third shielding layer bonded to the second separating layer.

DESCRIPTION OF PREFERRED EMBODIMENTS OF THE INVENTION

Figure 1:
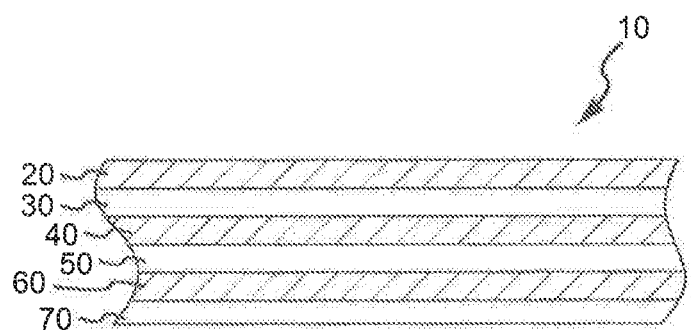
FIG. 1 shows a preferred embodiment of a shielding tape according to the invention.

Turning now to the drawings, where the purpose is to describe preferred embodiments of the invention and not limit same, FIG. 1 shows a shielding tape 10.

Shielding tape 10 according to the present invention comprises at least three layers of shielding material (which are also called "shielding layers"). As shown in FIG. 1, the shielding tape 10 comprises a laminate structure of aluminum 20/PET 30/aluminum 40/PET 50/aluminum 60, with a hot melt adhesive 70 (which is preferably EAA or EMAA) applied to aluminum layer 60.

The aluminum layers of the exemplary shielding tape 10 are each about 9 microns thick, while the separating layers are about 12 microns thick. There is also a layer of adhesive between each aluminum/PET layer of about 2 microns thick. The adhesive layer 70 is about 25 microns thick. Other embodiments of the present invention may include shielding layers of at least 3 microns thick, separating layers of at least 4 microns thick, and adhesive layers of at least 8 microns thick. Multiple shielding layers need not all be of the same thickness. Likewise, multiple separating layers and/or adhesive layers need not all have the same thickness.

Figure 7:
FIG. 7 shows a cross-sectional view of shielding tape having four shielding layers configured in accordance with the present technology.

The layers of shielding material may comprise any suitable material, such as aluminum, copper, silver, a magnetic alloy (such as Mu-metal), or combinations thereof, and need not each be formed from the same material(s). The shielding layers may be any suitable thickness, and need not each be the same thickness. Additionally, while the exemplary shielding tape depicted in FIG. 1 comprises three shielding layers, alternate embodiments of the present invention may include any suitable number of shielding layers greater than two, such as four or more layers of shielding material, each separated by a separator material. For example, FIG. 7 shows a shielding tape 10 comprising a first shielding layer 20 bonded to a first separating layer 30, and a second shielding layer 40 bonded to the first separating layer 30 and a second separating layer 50. The tape further comprises a third shielding layer 60 bonded to the second separating layer 50 and a third separating layer 61, as well as a fourth shielding layer 63 bonded to the third separating layer 61.

The separator layers are preferably plastic and may comprise any suitable material, such as polyester, polyethylene terephthalate ("PET"), a polyolefin (such as polypropylene), or combinations thereof, and need not each be formed from the same material(s). The separator layers may be any suitable thickness, and need not each be the same thickness. Additionally, while the exemplary shielding tape depicted in FIG. 1 comprises two plastic layers, each disposed between two of the three respective shielding layers, alternate embodiments of the present invention may include any suitable number of plastic layers.

The additional thickness of the shielding tape of the present invention can be accommodated by, for example, reducing slightly the diameter of the foam dielectric 120 to which it is applied. This allows the diameter of the cable 100 to remain the same as conventional cables, yet the slight reduction in the diameter of the dielectric does not substantially degrade the performance of the cable.

Because of the improved inner layer shielding, a bi-shield coaxial cable using the preferred shielding tape of the present invention (which has three shielding layers) can perform as well as some conventional tri-shield cables without the use of an outer shielding tape. This lowers the cost and complexity of manufacturing the cable. Additionally, connector attachment is easier since an outer shielding layer would normally need to be removed to install a connector. Likewise, a tri-shield coaxial cable using the preferred shielding tape of the present invention (which has three shielding layers) can perform as well as some quad-shield cables without the use of an outer shielding braid. Accordingly, the present invention provides cost savings (e.g., when a bi-shield cable of the present invention is used instead of a conventional tri-shield cable) and/or an improvement in shielding performance (e.g., when a tri-shield cable of the present invention is used instead of a conventional tri-shield cable).

Figure 4:
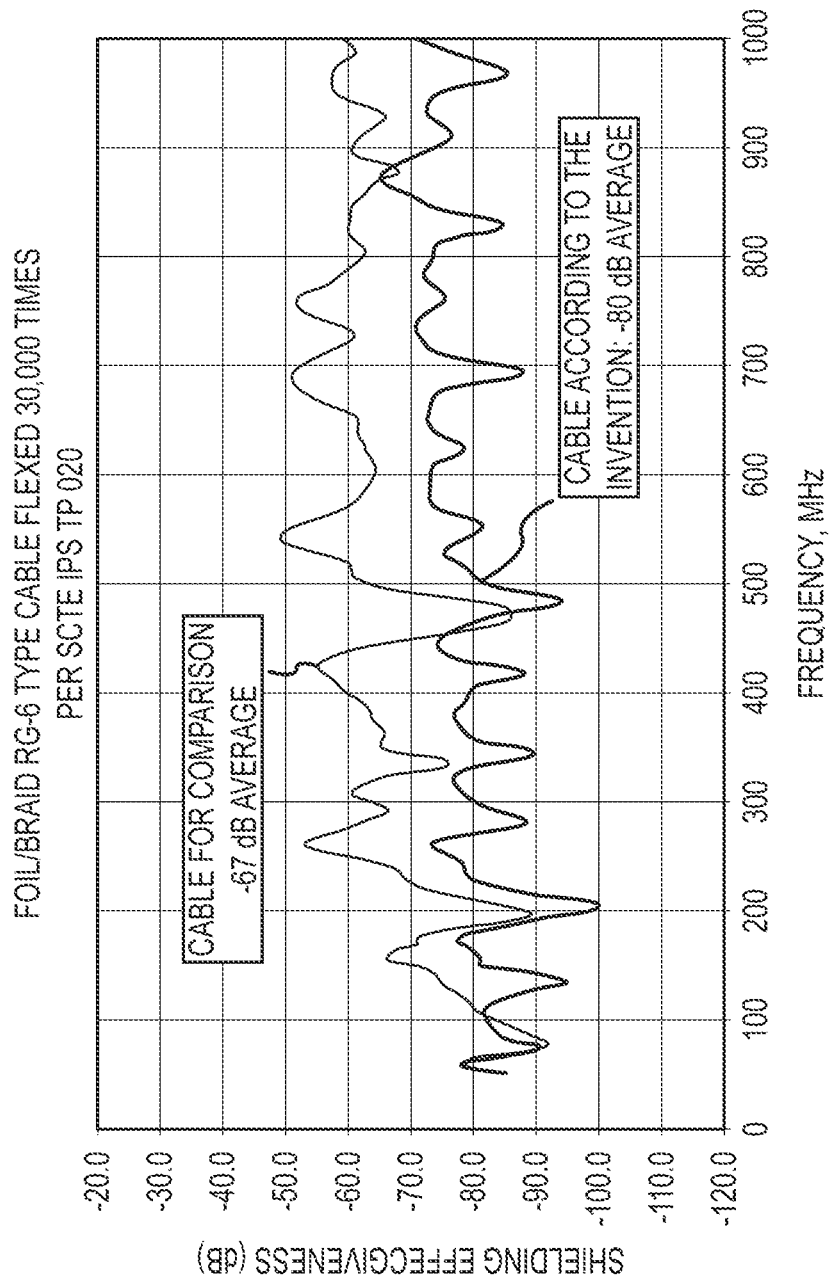
FIG. 4 is a graph depicting the improved performance of a preferred embodiment of the invention over a shielding tape having two shielding layers.

The shielding tape of the present invention also provides additional resistance to performance degradation due to wear. Upon repeated flexing of conventional cables, the shielding material (which is preferably aluminum) in each shielding layer can develop micro-cracks. These degrade shielding performance because the cracks in one shielding layer may align with the cracks in the other shielding layer, and RF can then egress or ingress through the cracks in each respective layer. The present invention reduces the effects of such cracks because cracks in each of the three layers are less likely to be aligned to provide a path for R.F. egress or ingress as compared to shielding tape with only one or two shielding layers. This is illustrated in FIG. 4.

Figure 2:
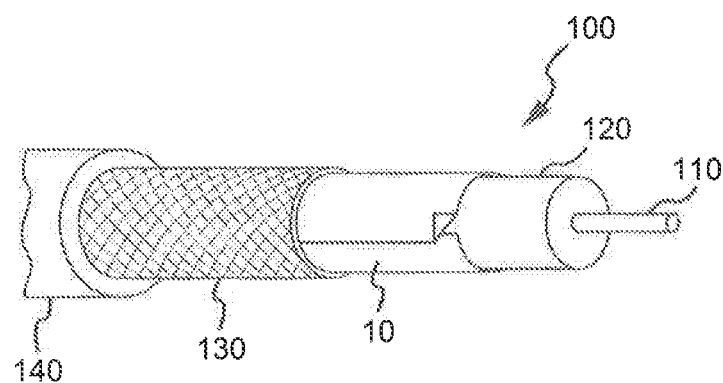
FIG. 2 shows the shielding tape of FIG. 1 included in a coaxial cable.

The exemplary bi-shield coaxial cable 100 in FIG. 2 comprises a center conductor 110 preferably formed from copper-clad steel and is about 0.0403" in diameter. The center conductor 110 may be any suitable diameter or thickness, such as between about 0.014" and about 0.200" in diameter. The center conductor 110 may also be formed from any other suitable conductive material, such as copper, copper-plated steel, and/or copper-plated aluminum. The center conductor 110 may be solid or may comprise multiple conductors, such as stranded wire. Surrounding the center conductor 110 is a dielectric 120 that is about 0.18" in diameter and preferably formed from foam polyethylene. The dielectric may be any suitable diameter, such as between about 0.040" and about 0.600" in diameter. The dielectric 120 may also be solid, and may be formed from any other suitable material, such as polypropylene or fluorinated ethylene propylene. The shielding tape 10 of the present invention is wrapped around, and preferably bonded (using an adhesive) to the dielectric 120. Surrounding the shielding tape 10 is a braid 130 preferably formed from 34-gauge aluminum wire. The braid 130 may be formed from any other suitable material, such as aluminum, copper, copper-plated steel, tinned copper, and/or copper-clad steel. An outer jacket 140 formed from polyvinyl chloride ("PVC") that is about 0.273" in diameter and about 0.03" thick surrounds the outer foil. The jacket 140 may be any suitable thickness, such as between about 0.007" and 0.080" thick. The jacket 140 may also be formed from any other flexible insulator, such as polyethylene, nylon, and/or TEFLON. The dimensions recited above are for an RG-6 type 75-Ohm coaxial cable, but the shielding tape of the present invention may be used with any other form of cable having components of any suitable dimension, such as 50-Ohm coaxial cables.

Figure 5A:
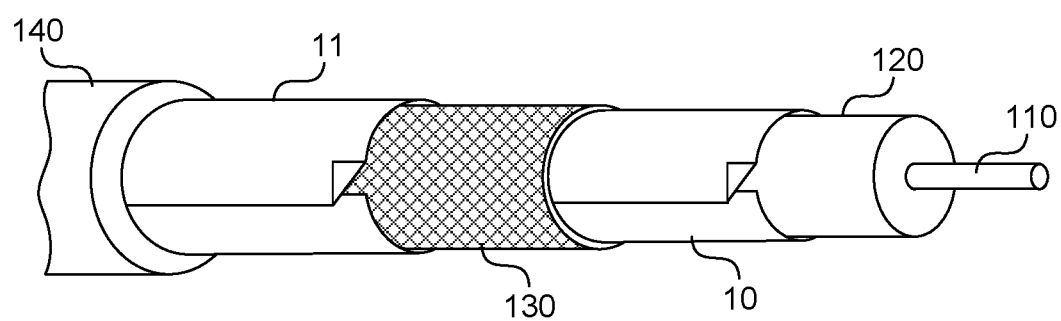
FIG. 5A shows a side perspective view of a tri-shield coaxial cable having an additional layer of shielding tape configured in accordance with the present technology.
Figure 5B:
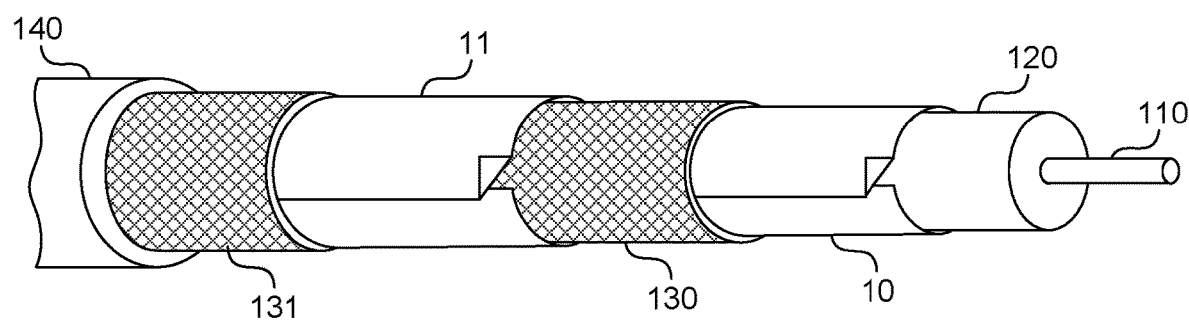
FIG. 5B shows a side perspective view of a quad-shield coaxial cable configured in accordance with the present technology.

Cables employing shielding tape of the present invention may also include additional layers of shielding tape and/or braid. For example, as shown in FIG. 5A, a tri-shield coaxial cable may include an additional layer of shielding tape 11 surrounding the braid 130, providing three layers of shielding (the outer foil 11, the braid 130, and the inner foil 10). The outer foil 11 may employ conventional shielding tape or the shielding tape of the present invention. In another example shown in FIG. 5B, the present invention may be used in conjunction with a quad-shield coaxial cable, which includes an outer foil layer 11 (as described above for the tri-shield cable) and an outer braid 131 surrounding the outer foil layer 11 to provide four layers of shielding.

Figure 6:
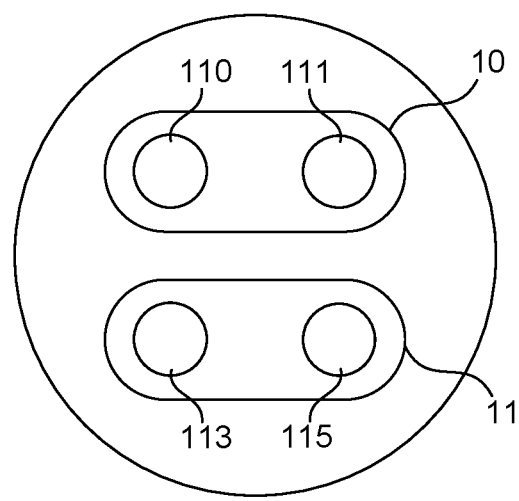
FIG. 6 shows a cross-sectional end view of a cable having a first center conductor and a second center conductor surrounded by a shielding tape configured in accordance with the present technology.

A shielding tape of the present invention may be used in conjunction with any other type of shielded cable, such as shielded twisted-pair ("STP") cabling. In an STP cable, for example, the shielding tape of the present invention may be used to surround each pair of one or more pairs of conductors twisted together. As shown in FIG. 6, in some embodiments the cable may have a first conductor 110 and a second conductor 111 surrounded by a first shielding tape 10. In yet other embodiments, the cable may also have third and fourth conductors, 113 and 115, respectively, surrounded by a second shielding tape 11. A shielding tape of the present invention may be used to surround any type of conductor, insulator, or other component of a shielded cable and may surround a conductor directly (i.e., there are no intervening structures between the conductor and the tape) or indirectly (i.e., there are one or more intervening structures between the conductor and the tape, such as a dielectric, braiding, or other shielding).

Figure 3:
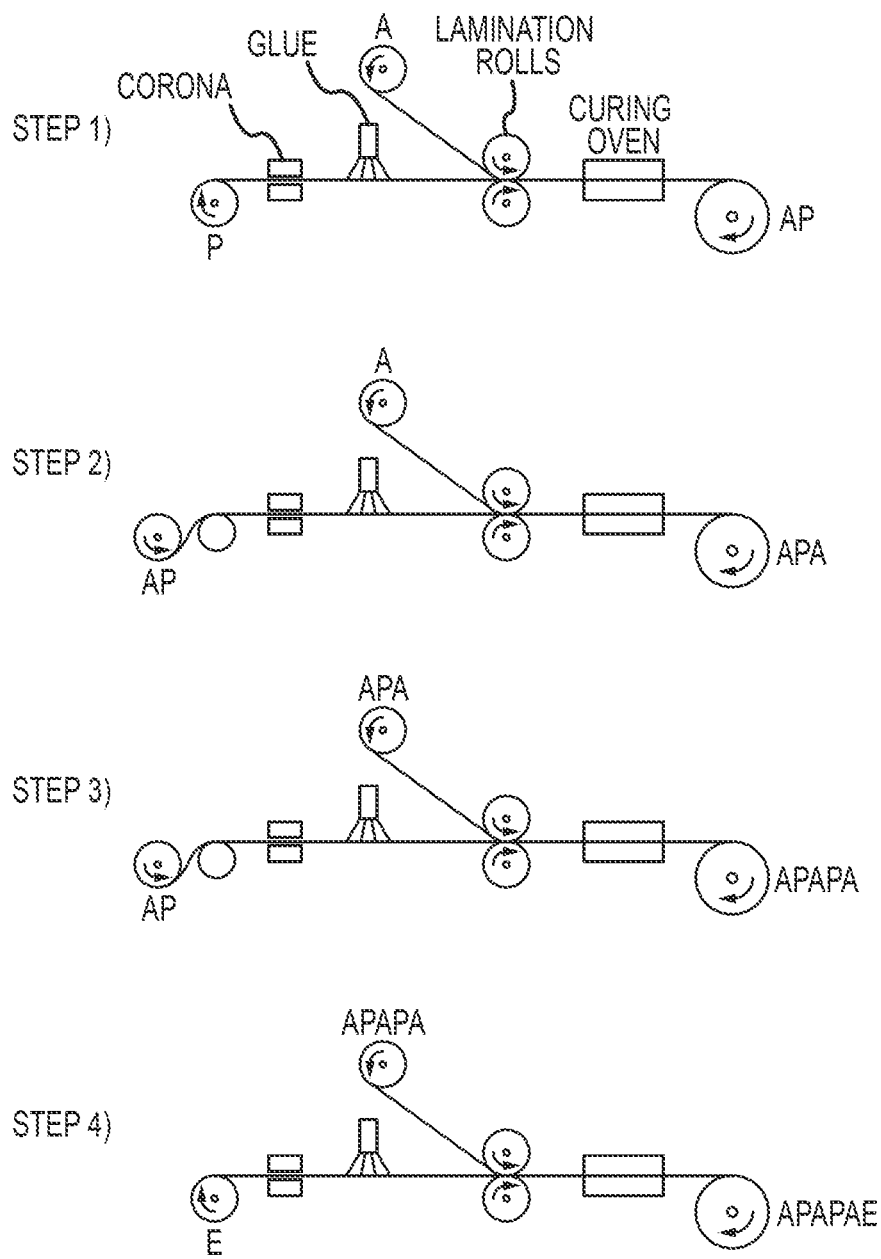
FIG. 3 shows diagrams illustrating how a shielding tape according to the invention is manufactured.

An exemplary process for manufacturing a shielding tape in accordance with the present invention is depicted in FIG. 3. In this process, lamination is used to bond multiple layers of materials into a sandwich structure. These materials are processed in the form of wide (typically 0.5 to 2 meters) and long (typically 1,000 to 50,000 meters) sheet. After all of the lamination layers are combined, the sheet is slit into multiple narrow tapes (typically 10 mm to 50 mm wide) and rolled up for use in manufacturing cable. The shielding tape contains metallic and polymeric strengthening layers interspersed with adhesive layers. An optional hot melt adhesive can be applied to one side of the laminate to bond it to a cable core. The desired tape construction is: A/P/A/P/A/E where A=aluminum, P=polyester and E=EMAA (a hot melt adhesive). This process can also be used to make other shield tape embodiments where A=other metal such as copper, lead or Mu metal and P=other polymers such as polypropylene and E=other adhesives such as EAA.

Referring again to FIG. 3, in step (1), polyester (P) and aluminum (A) sheets are fed from rolls into the laminator. Before lamination the polyester surface may be activated using a corona treatment whereby the sheet is passed through a high voltage corona discharge etching the surface to make the adhesive bond more effective. Next a thin layer (about 2 microns) of liquid adhesive is applied to the polyester sheet by spraying or by offset printing. The lamination rolls apply pressure and heat to bond the two sheets together. An oven is used to heat and cure the adhesive. The AP laminate is then rolled up for the next operation.

In step (2), the AP sheet and an A sheet are fed from rolls into the laminator. Once again, corona treatment may be used to activate the P surface prior to applying a thin layer of liquid adhesive. After lamination and oven curing the APA laminate is rolled up for the next operation.

In step (3), the sheet of AP manufactured in step 1 is combined with a sheet of APA manufactured in step 2 using lamination resulting in an APAPA layer, which is rolled up. This laminate with 3 metal shielding layers can be slit and used as is if no hot melt adhesive layer is needed.

In step (4), the sheet of APAPA manufactured in step 3 is combined with a sheet of E using the laminator. The E surface may be activated using corona treatment to improve adhesive bonding. After lamination and oven curing the APAPAE laminate is rolled up for slitting.

In step (5), the sheet of APAPA or APAPAE is slit into multiple tapes to the final width and then rolled up for use in cable manufacture.

As mentioned previously, the laminate shielding tape of the present invention provides better shielding effectiveness than cables with conventional tape, even after repeated flexing of the cable. This effectiveness is illustrated in the graph in FIG. 4.

Having thus described preferred embodiments of the invention, other variations and embodiments that do not depart from the spirit of the invention will become apparent to those skilled in the art. The scope of the present invention is thus not limited to any particular embodiment, but is instead set forth in the appended claims and the legal equivalents thereof. Unless expressly stated in the written description or claims, the steps of any method recited in the claims may be performed in any order capable of yielding the desired result.

What is claimed is:

1. A coaxial cable comprising:
    a conductor;
    a dielectric surrounding the conductor;
    a shielding tape surrounding the dielectric, the shielding tape manufactured by a method including:
        exposing a first surface of a first separating layer to a first corona discharge;
        applying a first adhesive to at least one of the exposed first surface of the first separating layer or a first surface of a first shielding layer;
        pressing the first surface of the first shielding layer against the first surface of the first separating layer after application of the first adhesive;
        exposing a second surface of the first separating layer to a second corona discharge;
        applying a second adhesive to at least one of the exposed second surface of the first separating layer or a first surface of a second shielding layer;
        pressing the first surface of the second shielding layer against the second surface of the first separating layer after application of the second adhesive;
        exposing a first surface of a second separating layer to a third corona discharge;
        applying a third adhesive to at least one of the exposed first surface of the second separating layer or a first surface of a third shielding layer;
        pressing the first surface of the third shielding layer against the first surface of the second separating layer after application of the third adhesive;
        exposing a second surface of the second separating layer to a fourth corona discharge;
        applying a fourth adhesive to at least one of the exposed second surface of the second separating layer or a second surface of the second shielding layer; and
        pressing the second surface of the second shielding layer against the second surface of the second separating layer after application of the fourth adhesive;
    a braided metal surrounding the shielding tape; and
    an outer jacket surrounding the braided metal.

2. The coaxial cable of claim 1 wherein
    the first and second separating layers are polymer layers, and
    the first, second and third shielding layers are metal layers.

3. The coaxial cable of claim 1 wherein
    the first and second separating layers are polyester layers, and
    the first, second and third shielding layers are aluminum layers.

4. The coaxial cable of claim 1 wherein
    the first and second separating layers are polyester layers,
    at least one of the first, second or third shielding layers is a copper layer, and any other of the first, second or third shielding layers are aluminum layers.

5. The coaxial cable of claim 1 wherein
the first shielding layer is a copper layer,
the second and third shielding layers are aluminum layers, and
the first shielding layer is positioned between the dielectric and the second and third shielding layers.

6. The coaxial cable of claim 1 wherein each of the first, second and third shielding layers is between about 3 microns and about 9 microns thick.

7. The coaxial cable of claim 1 wherein each of the first and second separating layers is between about 4 microns and about 12 microns thick.

8. The coaxial cable of claim 1 wherein the dielectric is between about 0.040 inch and about 0.600 inch in diameter.

9. The coaxial cable of claim 1 wherein the first and second separating layers and the first, second and third shielding layers form a lamination in which the first, second and third shielding layers are individually separated from each other by the first and second separating layers.

10. The coaxial cable of claim 1 wherein two or more of the first, second, third, and fourth corona discharges are different corona discharges.

11. The coaxial cable of claim 1 wherein two or more of the first, second, third, and fourth corona discharges are the same corona discharge.

12. The coaxial cable of claim 1 wherein two or more of the first, second, third, and fourth adhesives are different adhesives.

13. The coaxial cable of claim 1 wherein two or more of the first, second, third, and fourth adhesives are the same adhesive.

14. A coaxial cable comprising:
a conductor;
a dielectric surrounding the conductor;
a shielding tape surrounding the dielectric, the shielding tape manufactured by a method including:
activating a first surface of a first separating layer to etch the first surface of the first separating layer;
applying a first adhesive to at least one of the etched first surface of the first separating layer or a first surface of a first shielding layer;
pressing the first surface of the first shielding layer against the first surface of the first separating layer after application of the first adhesive;
activating a second surface of the first separating layer to etch the second surface of the first separating layer;
applying a second adhesive to at least one of the etched second surface of the first separating layer or a first surface of a second shielding layer;
pressing the first surface of the second shielding layer against the second surface of the first separating layer after application of the second adhesive;
activating a first surface of a second separating layer to etch the first surface of the second separating layer;
applying a third adhesive to at least one of the etched first surface of the second separating layer or a second surface of the second shielding layer;
pressing the second surface of the second shielding layer against the first surface of the second separating layer after application of the third adhesive;
activating a second surface of the second separating layer to etch the second surface of the second separating layer;
applying a fourth adhesive to at least one of the etched second surface of the second separating layer or a first surface of a third shielding layer; and
pressing the first surface of the third shielding layer against the second surface of the second separating layer after application of the fourth adhesive, wherein, after the pressing steps, the first and second separating layers and the first, second and third shielding layers form a lamination in which the first, second and third shielding layers are individually separated from each other by the first and second separating layers.

15. The coaxial cable of claim 14, further comprising a braided metal surrounding the shielding tape.

16. The coaxial cable of claim 14 wherein
the first and second separating layers are polymer layers, and
the first, second and third shielding layers are metal layers.

17. The coaxial cable of claim 14 wherein
at least one of the first, second or third shielding layers is a copper layer, and
any other of the first, second or third shielding layers are aluminum layers.

18. The coaxial cable of claim 14 wherein
the first shielding layer is a copper layer,
the second and third shielding layers are aluminum layers, and
the first shielding layer is positioned between the dielectric and the second and third shielding layers.

19. The coaxial cable of claim 14 wherein two or more of the first, second, third, and fourth adhesives are different adhesives.

20. The coaxial cable of claim 14 wherein two or more of the first, second, third, and fourth adhesives are the same adhesive.

* * * * *